US010032846B2

(12) United States Patent
Choi et al.

(10) Patent No.: US 10,032,846 B2
(45) Date of Patent: Jul. 24, 2018

(54) DISPLAY DEVICE

(71) Applicant: SAMSUNG DISPLAY CO., LTD., Yongin-si, Gyeonggi-do (KR)

(72) Inventors: Jun Won Choi, Cheonan-si (KR); Chang Soo Pyon, Seongnam-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 12 days.

(21) Appl. No.: 15/383,294

(22) Filed: Dec. 19, 2016

(65) Prior Publication Data

US 2017/0317158 A1 Nov. 2, 2017

(30) Foreign Application Priority Data

Apr. 29, 2016 (KR) .................. 10-2016-0053034

(51) Int. Cl.
*H01L 27/32* (2006.01)
*G09G 3/3233* (2016.01)
*G09G 3/3258* (2016.01)
*H01L 27/12* (2006.01)

(52) U.S. Cl.
CPC ....... *H01L 27/3276* (2013.01); *G09G 3/3233* (2013.01); *G09G 3/3258* (2013.01); *H01L 27/3248* (2013.01); *H01L 27/3262* (2013.01); *G09G 2310/06* (2013.01); *G09G 2330/021* (2013.01); *G09G 2330/08* (2013.01); *H01L 27/124* (2013.01)

(58) Field of Classification Search
None
See application file for complete search history.

(56) References Cited

U.S. PATENT DOCUMENTS

2014/0111404 A1* 4/2014 Omata ................. H05B 33/08
345/76
2014/0367664 A1* 12/2014 Park .................... H01L 27/3276
257/40
2016/0204172 A1* 7/2016 Park .................... H01L 27/3248
257/40

(Continued)

FOREIGN PATENT DOCUMENTS

KR   10-1103615      1/2012
KR   10-2015-0021667  3/2015

*Primary Examiner* — Lex Malsawma
(74) *Attorney, Agent, or Firm* — F.Chau & Associates, LLC

(57) ABSTRACT

A display device according to an exemplary embodiment of the present invention includes: a scan line extending in a first direction; a data line crossing the scan line and transmitting a data signal; a driving voltage line crossing the scan line and transmitting a driving voltage; a conductive member including a portion connected to the driving voltage line and overlapping the data line, wherein a first insulation layer is interposed between the conductive member and the data line; and a control line including a plurality of main line portions each extending in the first direction, and a detour portion that is located between two of the plurality of main line portions that are adjacent one another in a plan view, wherein the detour portion connects the two adjacent main line portions together, wherein a part of the detour portion is located between the conductive member and the driving voltage line in the plan view.

26 Claims, 11 Drawing Sheets

(56) References Cited

U.S. PATENT DOCUMENTS

| | | | | |
|---|---|---|---|---|
| 2016/0321994 A1* | 11/2016 | Lee | ................... | G09G 3/3258 |
| 2016/0321995 A1* | 11/2016 | Shin | ................... | G09G 3/3258 |
| 2016/0321996 A1* | 11/2016 | Lee | ................... | G09G 3/3258 |
| 2016/0322443 A1* | 11/2016 | Her | ................... | H01L 27/3262 |
| 2017/0117343 A1* | 4/2017 | Oh | ................... | G09G 3/3233 |

* cited by examiner

DISPLAY DEVICE

CROSS-REFERENCE TO RELATED APPLICATION

This U.S. patent application claims priority under 35 U.S.C. § 119(a) to Korean Patent Application No. 10-2016-0053034 filed in the Korean Intellectual Property Office on Apr. 29, 2016, the disclosure of which is incorporated by reference in its entirety herein.

BACKGROUND

(a) Technical Field

The present disclosure relates to a display device, and more particularly to an organic light emitting display device.

(b) Discussion of Related Art

An organic light emitting display device includes a cathode, an anode and an organic emission layer located between the cathode and anode. Electrons injected from the cathode among and holes injected from the anode are combined in the organic emission layer such that excitons are formed, and the excitons discharge energy such that light can be emitted.

The organic light emitting display device includes a plurality of pixels for displaying an image. The pixels each include an organic light emitting diode formed of a cathode, an anode, and an organic emission layer, a plurality of transistors provided for driving the organic light emitting diode, and at least one capacitor.

However, parasitic capacitances may occur in the organic light emitting display device. These parasitic capacitances may change a luminance of one or more of the pixels, thereby reducing image quality. Thus, there is a need for an organic light emitting display device that reduces or prevents these parasitic capacitances.

SUMMARY

A display device according to an exemplary embodiment of the present invention includes: a scan line extending in a first direction; a first data line crossing the scan line and transmitting a data signal; a first driving voltage line crossing the scan line and transmitting a driving voltage; a conductive member including a portion connected to the first driving voltage line and overlapping the first data line, wherein a first insulation layer is interposed between the conductive member and the first data line; and a control line including a plurality of main line portions each extending in the first direction, and a detour portion that is located between two of the plurality of main line portions that are adjacent one another in a plan view, where the detour portion connects the two adjacent two main line portions together, wherein part of the detour portion is located between the conductive member and the first driving voltage line in the plan view.

In an embodiment, the display device further includes a driving gate electrode spaced apart from the control line, wherein the detour portion includes a portion located between the first driving gate electrode and the conductive member in the plan view.

In an embodiment, the display device further includes a semiconductor member including a first channel region overlapping the first driving gate electrode, wherein a second insulation layer is interposed between the semiconductor member and the first channel region, wherein the semiconductor member includes a plurality of channel regions and a conductive region, the plurality of channel regions including the first channel region, and the conductive region include the conductive member.

In an embodiment, the plurality of channel regions include at least one channel region overlapping the control line.

In an embodiment, the first insulation layer includes a contact hole disposed on the conductive region of the semiconductor member, and the first driving voltage line is connected to the conductive region through the contact hole.

In an embodiment, the conductive member is connected to the conductive region that is connected to the first driving voltage line through a connection portion extending in a direction that is different from an extending direction of the conductive member.

In an embodiment, the detour portion includes a pair of vertical portions extending in parallel with the first data line and a horizontal portion connecting the pair of vertical portions.

In an embodiment, the scan line is located in a same layer as the control line in a cross sectional view, and the plurality of channel regions includes at least one channel region overlapping the scan line.

In an embodiment, the horizontal portion is located between the conductive member and the scan line in the plan view.

In an embodiment, the driving gate electrode is located between the scan line and the horizontal portion of the control line in the plan view.

In an embodiment, the horizontal portion crosses the first data line.

In an embodiment, the vertical portion is located between the conductive member and the first driving gate electrode in the plan view.

In an embodiment, the first driving voltage line extends in a second direction that crosses the first direction, and the first driving voltage line includes a first expansion portion that extends in the first direction, the first driving voltage line overlapping the first driving gate electrode and the first insulation layer interposed between the first driving voltage line and the first driving gate electrode forms a capacitor.

In an embodiment, the display device further includes a second data line adjacent the first data line, where the conductive member overlaps the second data line.

In an embodiment, the display device further includes a second driving gate electrode, a second driving voltage line having a second expansion portion that extends in the first direction, where the two driving gate electrodes are located between the two data lines, and wherein the two expansion portions respectively overlapping the two driving gate electrodes are connected to each other.

In an embodiment, the main line portions do not overlap the conductive member, and the detour portion does not overlap the conductive member and extends along a periphery of the conductive member.

In an embodiment, the conductive member includes a recess portion that does not overlap the data line in the plan view, and the recess portion is disposed on the extension line of the main line portion.

A display device according to an exemplary embodiment of the present invention includes: a scan line extending in a first direction; a data line and a driving voltage line extending in a second direction that crosses the first direction; a control line including a first portion that is parallel with the first direction, a second portion connected to the first portion and parallel with the second direction, and a third portion connected to the second portion and parallel with the first direction; and a driving gate electrode located between a first scan line among the plurality of scan lines and the first portion of the control line in a plan view, wherein the second portion of the control line is located between the data line and the driving gate electrode in the plan view, and the third portion of the control line crosses the data line.

In an embodiment, the display device further includes a conductive member connected to the driving voltage line and overlapping the data line, wherein an extension of the first portion extends past an edge of the conductive member, and the second portion and the third portion extend along the periphery of the conductive member.

In an embodiment, the second portion is located between the driving gate electrode and the conductive member in the plan view.

In an embodiment, the display device further includes a semiconductor member including a channel region overlapping the driving gate electrode, an insulation layer interposed between the channel region and the driving gate electrode, and a conductive region connected to the channel region, wherein the conductive region may include the conductive member.

According to an exemplary embodiment, a display device having a plurality of pixels is presented. Each pixel includes an organic light emitting diode (OLED), an a light emission control transistor connected to the OLED, a control line configured to apply an emission control signal to a gate electrode of the light emission control transistor and a gate electrode of the operation control transistor, a data line transmitting a data signal, and a conductor overlapping the data line and receiving a driving voltage, where the control line is bent around a periphery of the conductor.

In an embodiment, the control line includes a first portion arranged in a direction of the data line, a second portion arranged in a direction perpendicular to the data line, and a third portion arranged in the direction of the data line.

In an embodiment, the conductor includes a recess portion that does not overlap the data line that connects a remaining portion of the conductor to a driving voltage line supplying the driving voltage.

In an embodiment, a width of the recess portion is less than a width of the remaining portion.

In an embodiment, the display device further includes: an operation control transistor connected between the driving voltage and the light emission control transistor, a driving transistor connected between the operation control transistor and the light emission control transistor; a capacitor connected between the driving voltage and a gate of the driving transistor; and a switching transistor connected between the data line and a node between the operation control transistor and the driving transistor, where a gate electrode of the switching transistor receives a scanning signal.

DETAILED DESCRIPTION OF THE EMBODIMENTS

Figure 1:
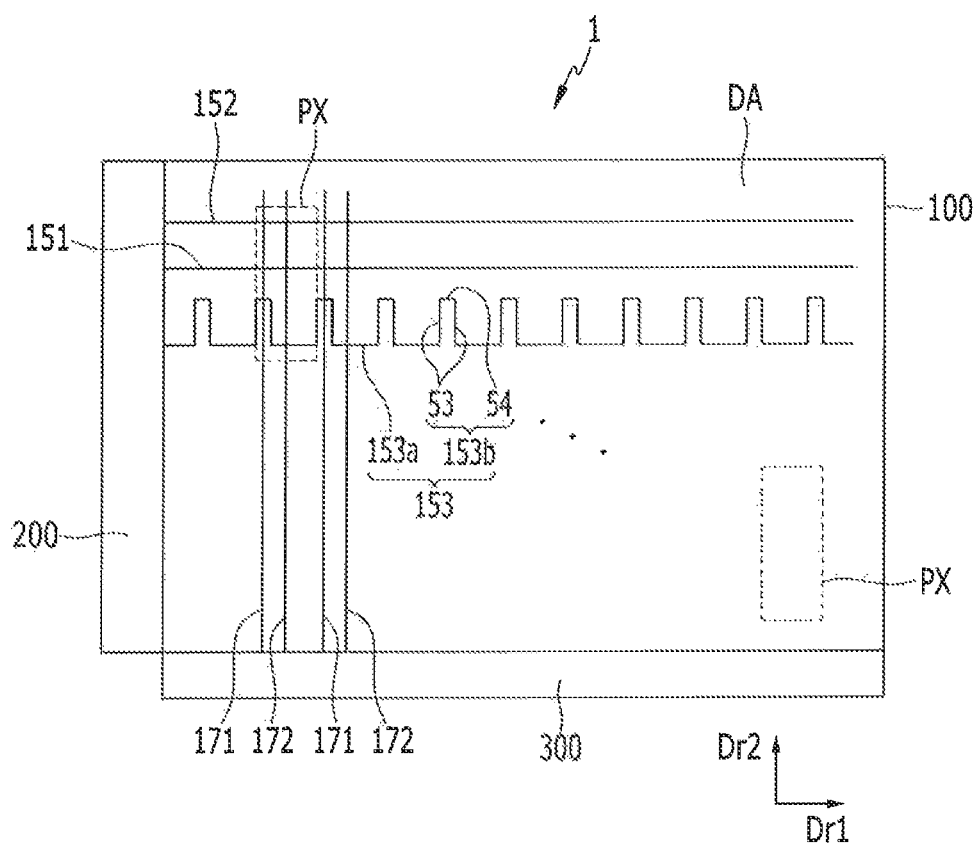
FIG. 1 is a schematic layout view of a display device according to an exemplary embodiment of the present invention.

The present invention will be described more fully hereinafter with reference to the accompanying drawings, in which exemplary embodiments of the invention are shown. However, the described embodiments may be modified in various different ways, all without departing from the spirit or scope of the present invention. Like reference numerals designate like elements throughout the specification.

It will be understood that when an element such as a layer, film, region, or substrate is referred to as being "on" another element, it can be directly on the other element or intervening elements may also be present.

Further, in this specification, the phrase "in a plane view" means viewing a target portion from the top, and the phrase "in a cross-section" means viewing a cross-section by vertically cutting a target portion from the side.

Hereinafter, a display device according to an exemplary embodiment of the present invention will be described with reference to FIG. 1.

FIG. 1 is a schematic layout view of a display device according to an exemplary embodiment of the present invention.

Referring to FIG. 1, a display device 1 according to an exemplary embodiment of the present invention includes a display panel 100, a first driver 200 (e.g., a first driver circuit), and a second driver 300 (e.g., a second driver circuit).

The display panel 100 includes a display area DA where an image can be displayed. The display area DA includes a plurality of pixels PX and a plurality of signal lines 151, 152, 153, 171, and 172. Each pixel PX is a minimum unit for displaying an image, and the display device can display an image using the plurality of pixels PX.

In an embodiment, each pixel PX include a plurality of transistors (not shown) connected to the plurality of signal lines 151, 152, 153, 171, and 172, a capacitor (not shown), and an organic light emitting diode (not shown).

The signal lines 151, 152, 153, 171, and 172 may include a plurality of scan lines 151 and 152 (e.g., gate lines), a plurality of control lines 153, a plurality of data lines 171, and a plurality of driving voltage lines 172.

The plurality of scan lines 151 and 152 may transmit a scan signal or a gate signal. The scan signal may include a gate-on voltage and/or a gate-off voltage that can turn on/turn off at least one transistor included in each pixel PX. For example, the gate-on voltage may be used to turn on a transistor and the gate-off voltage may be used to turn off the transistor, where a logic level of the gate-on voltage differs from that of the gate-off voltage. In an embodiment, the scan lines 151 and 152 connected to a pixel PX include a present scan line 151 and a previous scan line 152 through which a gate-on voltage is transmitted with different timing from timing of the present scan line 151.

In an embodiment, the plurality of scan lines 151 and 152 extend in parallel with a first direction Dr1 or extend substantially in parallel with the first direction Dr1.

The control line 153 may transmit a control signal. In an exemplary embodiment, the control line 153 transmits an emission control signal that controls light emission of an organic light emitting diode OLED of the pixel PX. For example, the emission control signal may control an amount of light being emitted by the OLED. In an embodiment, the control signal transmitted by the control line 153 includes a gate-on voltage and/or a gate-off voltage. In an embodiment, the control signal has a waveform that is different from the scan signal transmitted by the scan lines 151 and 152.

In an embodiment, the control line 153 includes curves or bends rather than extending in a constant direction. In an embodiment, the curves or bends repeat at regular intervals. In an embodiment, the control line 153 includes segments, where each segment includes a first portion extending in direction Dr2, a second portion extending in direction Dr1 connected to the first portion, a third portion extending in direction Dr2 connected to the second portion, and a fourth portion extending in direction Dr1 connected to the third portion. In particular, as shown in FIG. 1, the control line 153 may be regularly changed in shape with a constant pitch, and the constant pitch may be equal to the width of at least one pixel PX in the first direction Dr1. In an embodiment, each pixel includes only one of the segments. If a unit formed of n iterative pixels PX in the first direction Dr1 (here, n is a natural number greater than 1) exists, the width of at least one pixel PX in the first direction Dr1 may imply a pitch of an iterative unit. FIG. 1 exemplarily illustrates that the control line 153 is regularly bent with a unit of the width of one pixel PX in the first direction Dr1, but the invention is not limited thereto.

More specifically, the control line 153 may include a plurality of separated main line portions 153a that extend in parallel with the first direction Dr1 or substantially extend in parallel with the first direction Dr1, and detour portions 153b each provided between two adjacent main line portions 153a.

The detour portion 153b is connected with two end portions of every two adjacent main line portions 153a, which face each other. The detour portion 153b may include, for example, a pair of vertical portions 53 respectively connected to end portions of two adjacent main line portions 153a and facing each other, and a horizontal portion 54 provided between the pair of vertical portions 53 and connecting the pair of vertical portions 53. The vertical portion 53 may extend in or substantially extend in a second direction Dr2, which is a direction crossing the first direction Dr1, and the horizontal portion may extend in or substantially extend in the first direction Dr1, but the present invention is not limited thereto. In an exemplary embodiment, the second direction Dr2 is perpendicular (e.g., at a right angle) to or substantially perpendicular to the first direction Dr1, but the invention is not limited thereto. The horizontal portion 54 may approximately extend in parallel with the present scan line 151 at a distance from the present scan line 151, but the invention is not limited thereto.

One main line portion 153a and one detour portion 153b that are connected with each other form a single unit, and such units may be iteratively arranged along the first direction Dr1. In an embodiment, a distance between the center of the horizontal portion 54 of a single detour portion 153b and the center of the horizontal portion 54 of an adjacent detour portion 153b is equal to the width of one pixel PX in the first direction Dr1.

The data line 171 transmits a data signal. A value of the data signal may vary based on an image that is to be displayed. The data line 171 may extend in the second direction Dr2 or substantially extend in the second direction Dr2 and thus may cross the scan lines 151 and 152.

The driving voltage line 172 transmits a driving voltage ELVDD. In an embodiment, the driving voltage ELVDD is a non-varying or constant voltage. The driving voltage line may extend in the second direction Dr2 or substantially extend in the second direction Dr2 and thus may cross the scan lines 151 and 152.

Referring to FIG. 1, the main line portion 153a of the control line 153 does not include a portion overlapping the data line 171, and the detour portion 153b of the control line 153 includes a portion that crosses or overlaps the data line 171. That is, the control line 153 substantially extends in parallel with the first direction Dr1, and is then bent at a point that is adjacent to the data line 171 such that the detour portion 153b is formed.

In an embodiment, the data line 171 is located between a pair of vertical portions 53 of each detour portion 153b of the control line 153, and the horizontal portion 54 of the detour portion 153b overlaps the data line 171 while crossing the data line 171.

The first driver 200 and the second driver 300 may respectively transmit signals to the plurality of signal lines 151, 152, 153, 171, and 172. For example, the first driver 200 may include a scan driver (e.g., a gate driver) transmitting a scan signal to the plurality of scan lines 151 and 152, and the second driver 300 may include a data driver transmitting a data signal to the data line 171.

The first driver 200 may be directly formed on the display panel 100, together with the plurality of transistors included in the pixel PX, or may be attached as at least one driving circuit chip on the display panel 100. Alternatively, the first driver 200 is attached on a printed circuit film connected to the display panel 100, and thus the first driver 200 may transmit a signal to the display panel 100. The second driver 200 or the printed circuit film provided on the display panel 100 may be disposed in a peripheral area (not shown) of the display area DA. For example, the second driver 200 or the printed circuit film may be disposed outside the display area DA.

An example of a detailed structure and operation of the display device according to an exemplary embodiment of the present invention will be described with reference to FIG. 1, FIG. 2 and FIG. 3.

Figure 2:
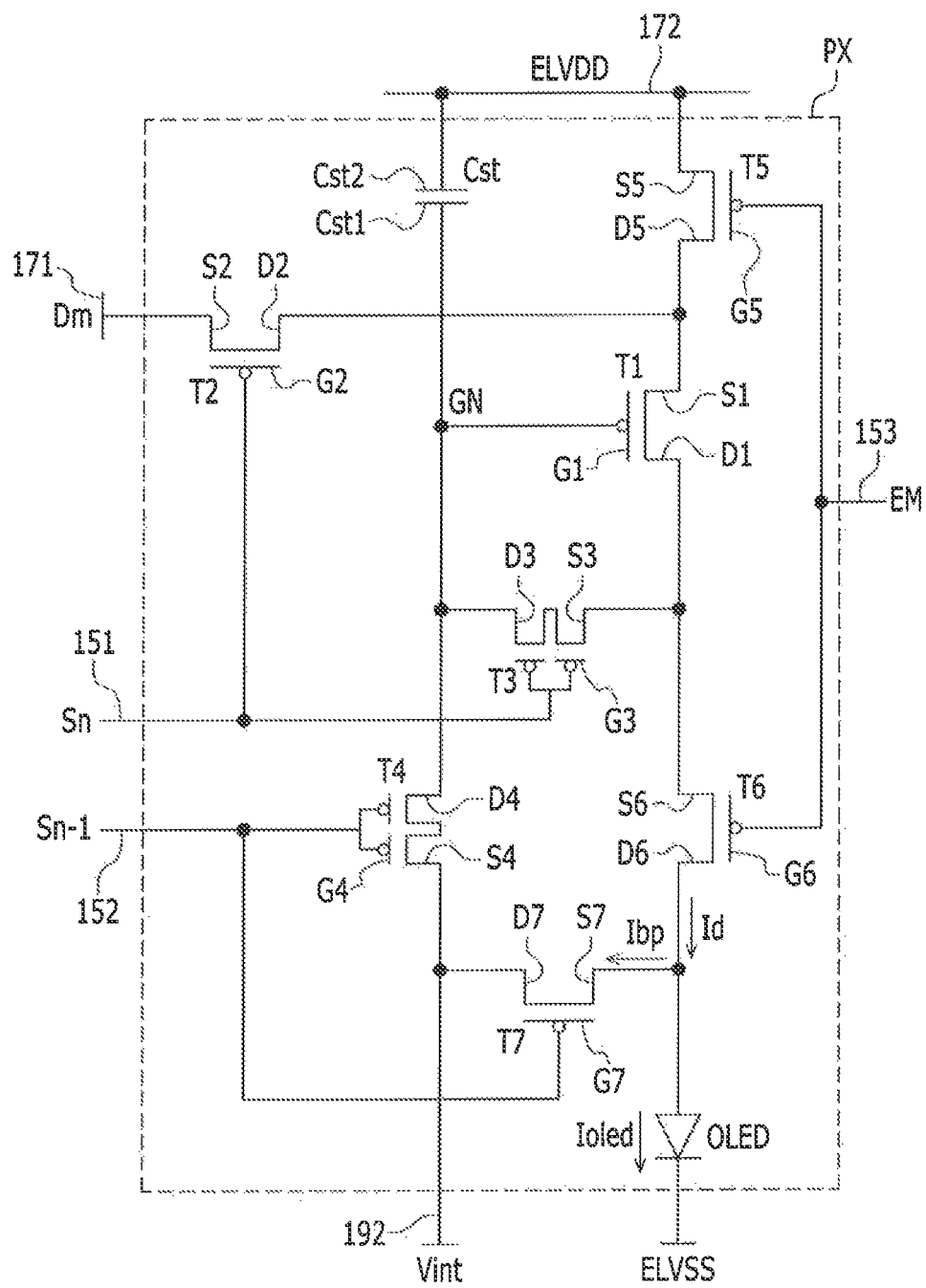
FIG. 2 is a circuit diagram of a pixel of the display device according to an exemplary embodiment of the present invention.
Figure 3:
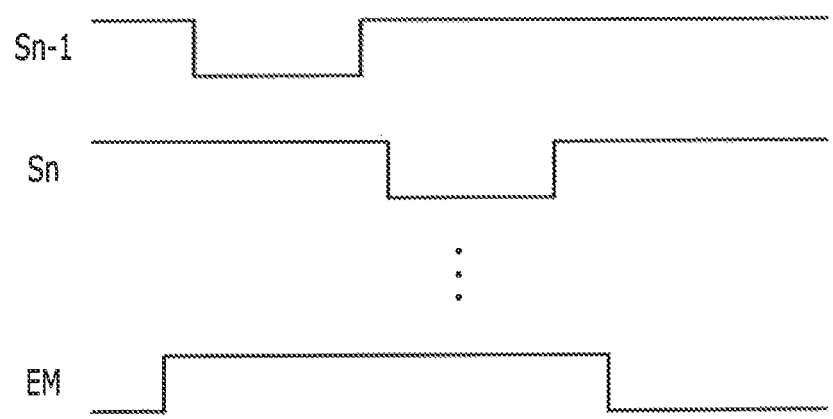
FIG. 3 is a timing diagram of a signal applied to the pixel of the display device according to an exemplary embodiment of the present invention.

FIG. 2 is a circuit diagram of one pixel (e.g., PX) in a display device according to an exemplary embodiment of the present invention, and FIG. 3 is a timing diagram of a signal applied to the pixel of the display device according to an exemplary embodiment of the present invention.

Referring to FIG. 2, the display device according to the present exemplary embodiment is an organic light emitting display device, and each pixel PX of the display device includes a plurality of transistors T1, T2, T3, T4, T5, T6, and T7 connected to a plurality of signal lines 151, 152, 153, 171, and 172, a capacitor Cst, and an organic light emitting diode OLED. Each pixel PX may include a single organic light emitting diode OLED.

The transistors T1, T2, T3, T4, T5, T6, and T7 may include a driving transistor T1, a switching transistor T2, a compensation transistor T3, an initialization transistor T4, an operation control transistor T5, a light emission control transistor T6, and a bypass transistor T7. In an embodiment, the compensation transistor T3 and the initialization transistor T4 have a dual gate electrode structure for decreasing leakage current.

A present scan line 151 may transmit a scan signal Sn to the switching transistor T2 and the compensation transistor T3, a previous scan line 152 may transmit a previous scan signal (Sn−1) to the initialization transistor T4 and the bypass transistor T7, and a control line 153 may transmit an emission control signal EM to the light emission control transistor T6.

A gate electrode G1 of the driving transistor T1 is connected with a first end Cst1 of the capacitor Cst, a source electrode S1 of the driving transistor T1 is connected with a driving voltage line 172 via the operation control transistor T5, and a drain electrode D1 of the driving transistor T1 is electrically connected with an anode of the organic light emitting diode OLED via the light emission control transistor T6. The driving transistor T1 receives a data signal Dm transmitted by the data line 171 depending on a switching operation of the switching transistor T2, and supplies a driving current Id to the organic light emitting diode OLED.

A gate electrode G2 of the switching transistor T2 is connected with the present scan line 151, a source electrode S2 of the switching transistor T2 is connected with the data line 171, and a drain electrode D2 of the switching transistor T2 is connected with the source electrode S1 of the driving transistor T1 and connected with the driving voltage line 172 via the operation control transistor T5. The switching transistor T2 is turned on according to the scan signal Sn received through the present scan line 151, and transmits the data signal Dm transmitted from the data line 171 to the source electrode S1 of the driving transistor T1.

A gate electrode G3 of the compensation transistor T3 is connected to the present scan line 151, and a source electrode S3 of the compensation transistor T3 is connected with the drain electrode D1 of the driving transistor T1 and is connected with an anode of the organic light emitting diode OLED via the light emission control transistor T6. The drain electrode D3 of the compensation transistor T3 is connected to a drain electrode D4 of the initialization transistor T4, the first end Cst1 of the capacitor Cst, and the gate electrode G1 of the driving transistor T1. The compensation transistor T3 is turned on according to the scan signal Sn received through the present scan line 151, and may diode-connect the driving transistor T1 by connecting the gate electrode G1 and the drain electrode D1 of the driving transistor T1 to each other.

The gate electrode G4 of the initialization transistor T4 is connected with the previous scan line 152, the source electrode S4 of the initialization transistor T4 is connected with an initialization voltage line 192, and the drain electrode D4 of the initialization transistor T4 is connected with the first end Cst1 of the capacitor Cst and the gate electrode G1 of the driving transistor T1 through the drain electrode D3 of the compensation transistor T3. The initialization transistor T4 is turned on according to the previous scan line (Sn−1) received through the previous scan line 152, and thus transmits the initialization voltage Vint to the gate electrode G1 of the driving transistor T1 such that an initialization operation that initializes a voltage of the gate electrode G1 of the driving transistor T1 can be performed.

A gate electrode G5 of the operation control transistor T5 is connected with the control line 153, a source electrode S5 of the operation control transistor T5 is connected with the driving voltage line 172, and a drain electrode D5 of the operation control transistor T5 is connected with the source electrode S1 of the driving transistor T1 and the drain electrode D2 of the switching transistor T2.

A gate electrode G6 of a light emission control transistor T6 is connected with the control line 153, a source electrode S6 of the light emission control transistor T6 is connected with the drain electrode D1 of the driving transistor T1 and the source electrode S3 of the compensation transistor T3, and a drain electrode D6 of the light emission control transistor T6 is electrically connected with an anode of the organic light emitting diode OLED. The operation control transistor T5 and the light emission control transistor T6 are simultaneously turned on according to the light emission control signal EM received through the control line 153 such that the driving voltage ELVDD is compensated through the diode-coupled driving transistor T1 and then transmitted to the organic light emitting diode OLED.

A gate electrode G7 of the bypass transistor T7 is connected with the previous scan line 152, a source electrode S7 of the bypass transistor T7 is connected with the drain electrode D6 of the light emission control transistor T6 and the anode of the organic light emitting diode OLED, and a drain electrode D7 of the bypass transistor T7 is connected to a terminal supplying the initialization voltage Vint and the source electrode S4 of the initialization transistor T4. Alternatively, the gate electrode G7 of the bypass transistor T7 may be connected with an additional control line (not shown).

In an embodiment, at least one of the transistors T1, T2, T3, T4, T5, T6, and T7 are a P-type channel transistor such as a positive metal-oxide semiconductor (PMOS), but the present invention is not limited thereto. In an embodiment, at least one of the transistors T1, T2, T3, T4, T5, T6, and T7 are an N-type channel transistor such as a negative metal-oxide semiconductor (NMOS), but the present invention is not limited thereto.

A second end Cst2 of the capacitor Cst is connected with the driving voltage line 172, and a cathode of the organic light emitting diode OLED is connected with a terminal supplying a common voltage ELVSS. In an embodiment, the common voltage is a ground voltage. In an embodiment, the common voltage ELVSS is lower than the driving voltage ELVDD.

A structure of the pixel PX according to an exemplary embodiment of the present invention is not limited to the structure shown in FIG. 2, and the number of transistors, the number of capacitors, and a connection relationship can be variously modified. For example, one or more of the transistors shown in FIG. 2 may be omitted to create a simpler pixel PX.

Next, a method for driving the display device according to an exemplary embodiment of the present invention will be described with reference to FIG. 2 and FIG. 3. In the present disclosure, the transistors T1, T2, T3, T4, T5, T6, and T7 will be described as P-type channel transistors for ease of discussion.

During an initialization period, a low-level previous scan signal Sn−1 is supplied through the previous scan line 152. Then, the initialization transistor T4 is turned on in response to the low-level previous scan signal Sn−1, the initialization voltage Vint is transmitted to the gate electrode G1 of the driving transistor T1 through the turned-on initialization transistor T4, and the driving transistor T1 is initialized with the initialization voltage Vint.

Next, when a low-level scan signal Sn is supplied through the present scan line 151 during a data programming and compensation period, the switching transistor T2 and the compensation transistor T3 are turned on in response to the low-level scan signal Sn. In this case, the driving transistor T1 is diode-coupled by the turned-on compensation transistor T3 and thus biased in a forward direction. Then, a compensation voltage Dm+Vth (Vth is a negative (−) value) reduced from the data signal Dm supplied from the data line 171 by a threshold voltage Vth of the driving transistor T1 is applied to the gate electrode G1 of the driving transistor T1. That is, a gate voltage applied to the gate electrode G1 of the driving transistor T1 becomes the compensation voltage (Dm+Vth).

The driving voltage ELVDD and the compensation voltage (Dm+Vth) are applied to opposite ends of the capacitor Cst, and a charge corresponding to a voltage difference between the opposite ends of the capacitor Cst is stored in the capacitor Cst.

Next, the light emission control signal EM supplied from the control line 153 is changed from a high level to a low level and maintained at the low level during a light emission period. Then, the operation control transistor T5 and the light emission control transistor T6 are turned on by the low-level light emission control signal EM during the light emission period. Thus, a driving current Id that depends on a voltage difference between the gate voltage of the gate electrode G1 of the driving transistor T1 and the driving voltage ELVDD is generated, and the driving current Id flows to the organic light emitting diode OLED through the light emission control transistor T6 such that a current holed flows to the organic light emitting diode OLED. A gate-source voltage Vgs of the driving transistor T1 is maintained at (Dm+Vth)-ELVDD by the capacitor Cst, and according to the current-voltage relationship of the driving transistor T1, the driving current Id may be proportional to the square of a voltage acquired by subtracting the threshold voltage Vth from the driving gate-source voltage, i.e., (Dm-ELVDD)$^2$. Accordingly, the driving current Id can be determined without regard to the threshold voltage Vth of the driving transistor T1.

Meanwhile, during the initialization period, the bypass transistor T7 receives the low-level previous scan signal (Sn−1) through the previous scan line 152 and is thus turned on. Thus, a part of the driving current Id may be drawn out through the bypass transistor T7 as a bypass current Ibp.

Next, a detailed structure of a display device according to an exemplary embodiment of the present invention will be exemplarily described with reference to FIG. 4 to FIG. 8, together with FIG. 1 to FIG. 3.

Figure 4:
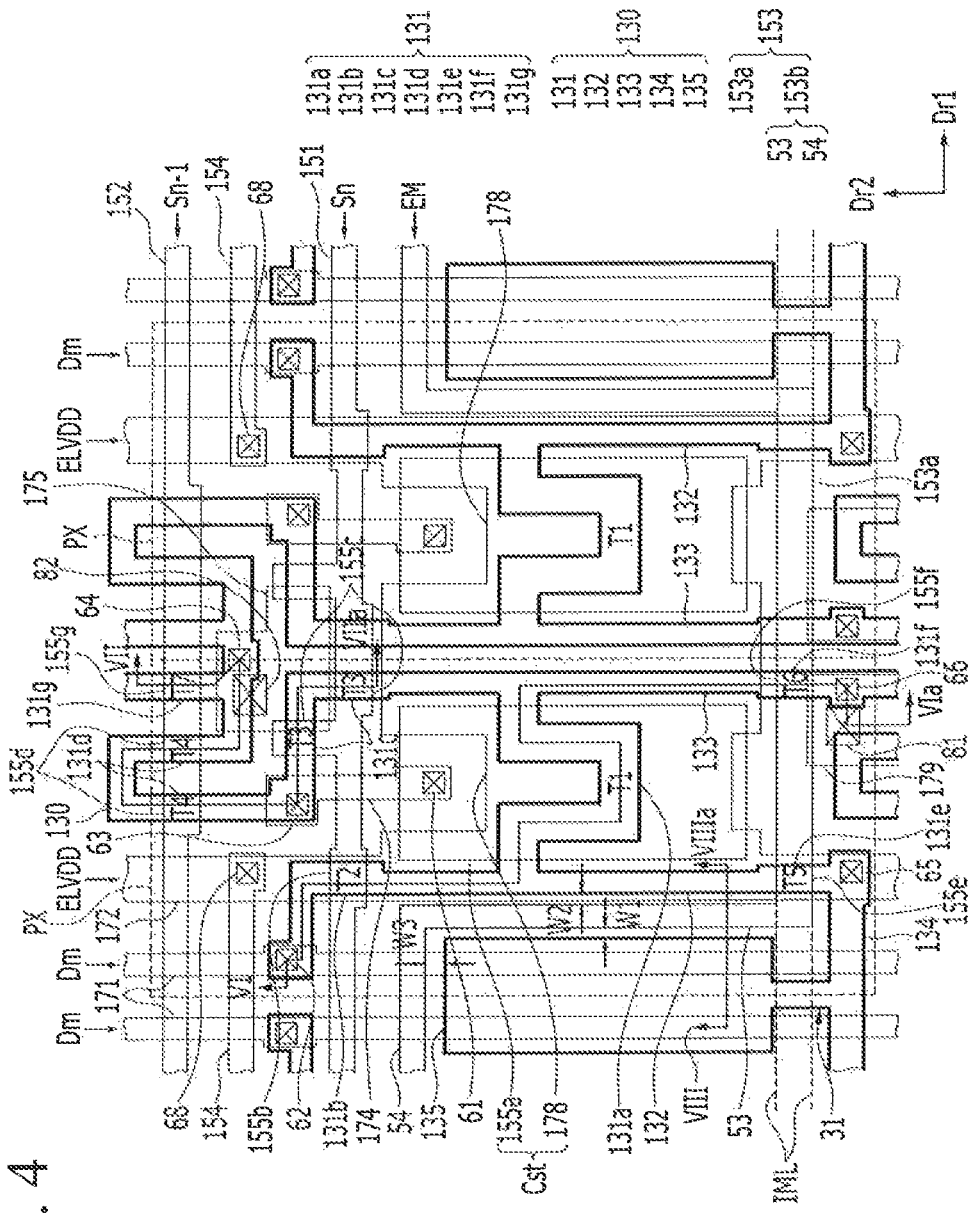
FIG. 4 is a layout view of two adjacent pixels in the display device according to an exemplary embodiment of the present invention.
Figure 5:
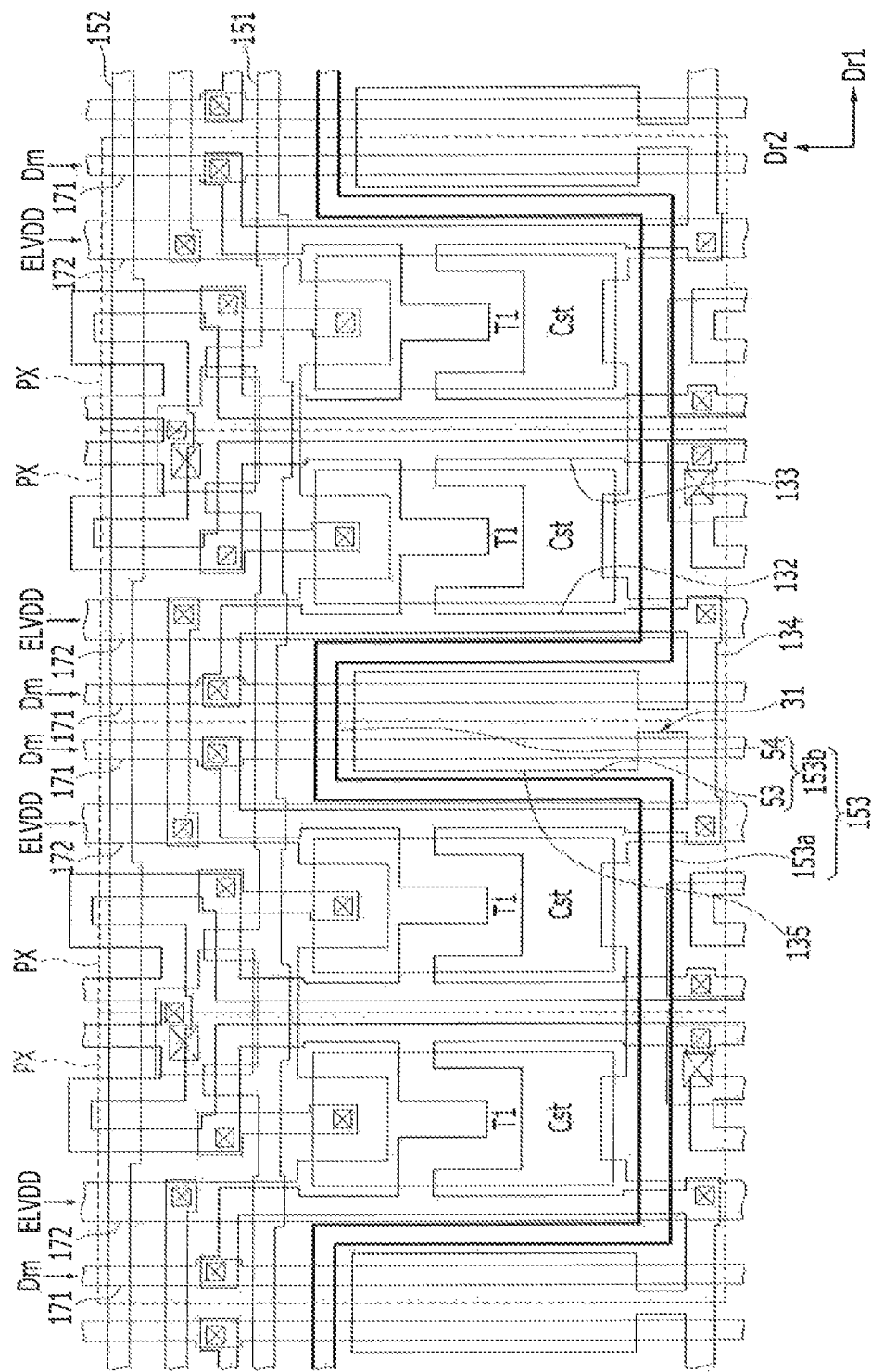
FIG. 5 is a layout view of four adjacent pixels in the display device according to an exemplary embodiment of the present invention.
Figure 6:
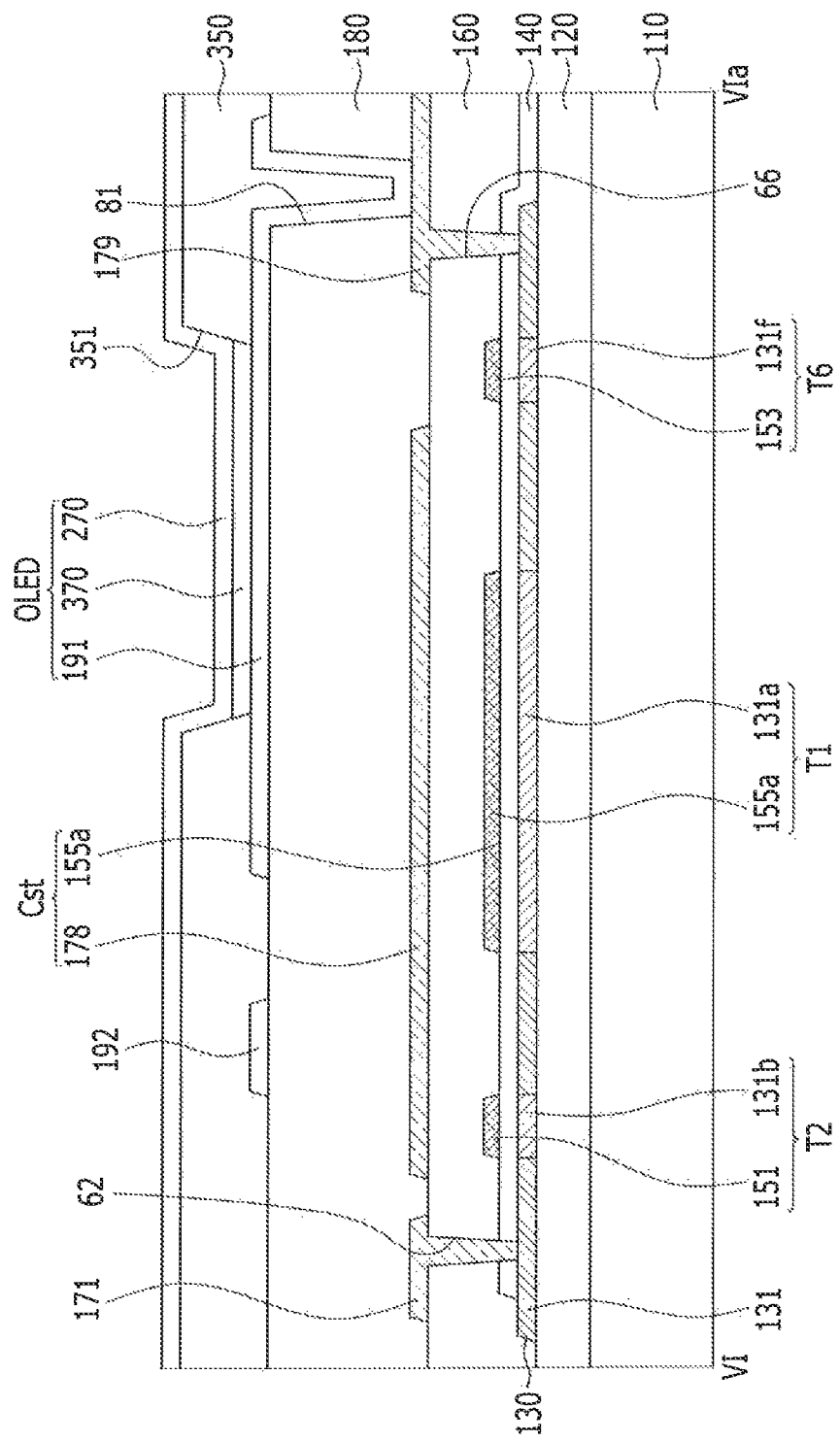
FIG. 6 is a cross-sectional view of the display device of FIG. 4, taken along the line VI-VIa.
Figure 7:
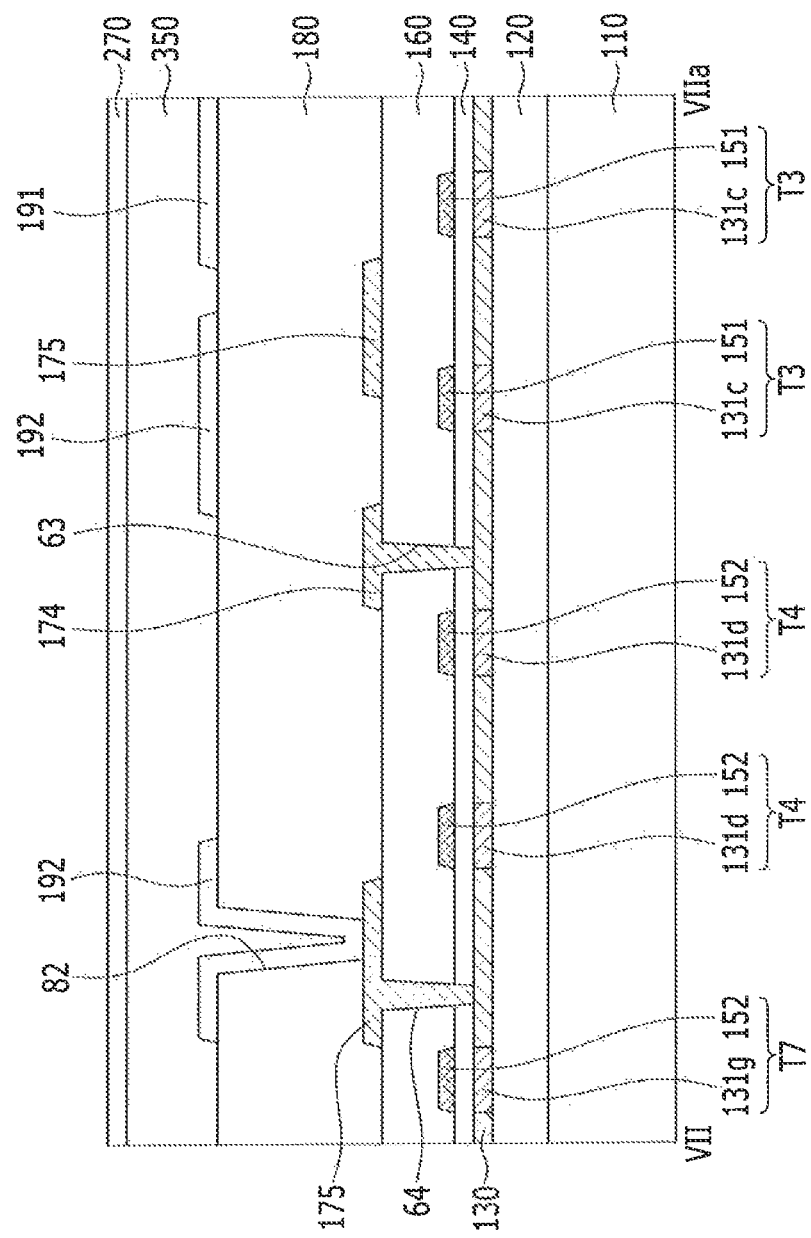
FIG. 7 is a cross-sectional view of the display device of FIG. 4, taken along the line VII-VIIa.
Figure 8:
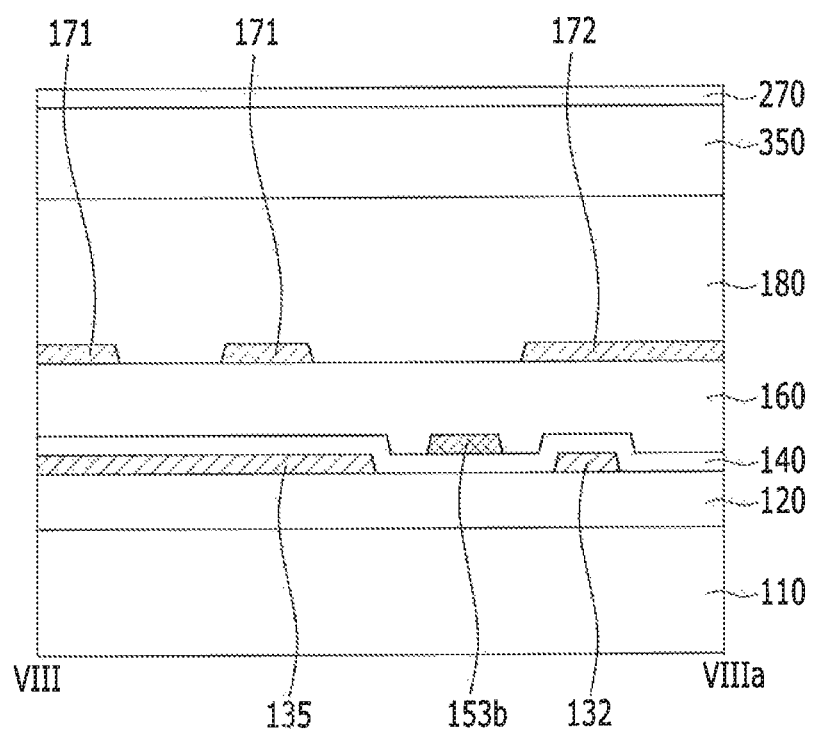
FIG. 8 is a cross-sectional view of the display device of FIG. 4, taken along the line VIII-VIIIa.

FIG. 4 is a layout view of two adjacent pixels in a display device according to an exemplary embodiment of the present invention, FIG. 5 is a layout view of four adjacent pixels in the display device according to the exemplary embodiment of the present invention, FIG. 6 is a cross-sectional view of the display device of FIG. 4 taken along the line VI-VIa, FIG. 7 is a cross-sectional view of the display device of FIG. 4 taken along the line VII-VIIa, and FIG. 8 is a cross-sectional view of the display device of FIG. 4, taken along the line VIII-VIIIa.

Referring to FIG. 4 and FIG. 5, a planar structure of the display device will be described, and then a cross-sectional structure of the display device will be described with reference to FIG. 6 to FIG. 8.

Referring to FIG. 4 and FIG. 5, together with FIG. 1 to FIG. 3, a pixel PX of the display device according to an exemplary embodiment of the present invention includes a plurality of transistors T1, T2, T3, T4, T5, T6, and T7, a capacitor Cst connected with a present scan line 151, a previous scan line 152, a control line 153, a data line 171, and a driving voltage line 172.

Referring to FIG. 4 and FIG. 5, two pixels that are adjacent in a first direction Dr1 are disposed symmetrical with respect to each other with reference to a boundary line therebetween, but the invention is not limited thereto. Further, the data line 171 and the driving voltage line 172 are disposed symmetrically with respect to each other with reference to the boundary line between the two adjacent pixels PX. Accordingly, the plurality of data lines 171 include two adjacent data lines.

The data line 171 and the driving voltage line 172 may extend in a second direction Dr2 or substantially extend in the second direction Dr2.

In an embodiment, the data line 171 overlaps a conductive member 135 receiving a constant voltage (e.g., ELVDD). The conductive member 135 may also be referred to as a shield electrode. In an embodiment, the data line 171 completely overlaps the conductive member 135 in the first direction Dr1. That is, in an embodiment, the width of the conductive member 135 in the first direction Dr1 is greater than the width of the data line 171 in the first direction Dr1. The conductive member 135 will be described later in detail.

In an embodiment, the driving voltage line 172 includes an expansion portion 178 that extends in the first direction Dr1. The expansion portion 178 extends in the opposite direction of a data line 171 that is adjacent to the driving voltage line 172, and a single expansion portion 178 may be provided in each pixel PX. In an embodiment, two expansion portions 178 respectively provided in two pixels that are adjacent in the first direction Dr1 without a data line 171 interposed therebetween are connected with each other. Accordingly, the driving voltage ELVDD transmitted through the driving voltage lines 172 with respect to the two adjacent pixels PX can be uniformly transmitted in the first direction Dr1 through the expansion portions 178 that are connected with each other.

The adjacent driving voltage lines 172 may be connected with each other through a connection member 154. The connection member 154 may extend in the first direction Dr1 or substantially extend in the first direction Dr1. The driving voltage line 172 is connected with the connection member 154 through a contact hole 68. Accordingly, the driving voltage ELVDD is transmitted in a second direction Dr2 along the driving voltage line 172 and is also transmitted to the first direction Dr1 through the connection member 154 such that the driving voltage ELVDD can be transmitted throughout the display panel 100 with a mesh structure. For example, the entire transmitting route for transmitting the driving voltage ELVDD may look like a net or a mesh to provide a more uniform driving voltage to the pixels. Thus, a voltage drop of the driving voltage ELVDD in the entire display panel 100 can be minimized.

Referring to FIG. 4, the previous scan line 152 is disposed above the present scan line 151, and the control line 153 is disposed below the present scan line 151.

As previously described, the control line 153 includes a plurality of main line portions 153a extending in parallel with the first direction Dr1 and detour portions 153b connected to the main line portions 153a. The main line portions 153a are disposed between two adjacent data lines 171, and do not overlap the data lines 171. The main line portion 153a is bent near the data line 171 and is then connected to the detour portion 153b. The detour portion 153b may include a vertical portion 53 that extends in the second direction Dr2 or substantially extends in the second direction Dr2, and a horizontal portion 54 that extends in a first direction Dr1 or substantially extends in the first direction Dr1, but the structure is not limited thereto. The vertical portion 53 extends toward the present scan line 151 from the main line portion 153a and is then connected to the horizontal portion 54 at the end thereof. In an embodiment, the horizontal portion 54 overlaps the data line 171 while crossing the data line 171.

Referring to FIG. 4 and FIG. 5, according to a symmetrical structure of two adjacent pixels PX, in an exemplary embodiment, a distance between the center of a horizontal portion 54 of one detour portion 153b and the center of a horizontal portion 54 of the adjacent detour portion 153b is equal to or greater than the width of the two pixels PX in the first direction Dr1. The width of two adjacent pixels PX in the first direction may be a pitch of a unit in the first direction Dr1, formed of every two adjacent pixels in the first direction Dr1. More specifically, as shown in FIG. 4 and FIG. 5, in an embodiment, the width of the two pixels PX in the first direction Dr1 is equal to a distance between the vertical center line between a pair of adjacent data lines 171 and the vertical center line between the next pair of adjacent data lines 171. The horizontal portion 54 may overlap a boundary of two pixels that are adjacent to each other, and an adjacent data line 171 may be interposed therebetween.

A channel of each of the plurality of transistors T1, T2, T3, T4, T5, T6, and T7 may be formed in a single semiconductor member 130, and the semiconductor member 130 may be bent with various shapes. The semiconductor member 130 may be made of a semiconductor material such as a polysilicon or oxide semiconductor.

The semiconductor member 130 includes a channel region 131 forming the channel of each of the transistors T1, T2, T3, T4, T5, T6, and T7. The channel region 131 is a semiconductor. In the drawing, channel regions 131 of the respective transistors T1, T2, T3, T4, T5, T6, and T7 are denoted as 131a, 131b, 131c, 131d, 131e, 131f, and 131g.

In an embodiment, the semiconductor member 130 includes a conductive region disposed at lateral sides of each of the channel regions 131a, 131b, 131c, 131d, 131e, 131f, and 131g. In an embodiment, the semiconductor member 130 has a higher carrier concentration than a carrier concentration of the channel regions 131a, 131b, 131c, 131d, 131e, 131f, and 131g. In the semiconductor member 130, other portions, excluding the channel regions 131a, 131b, 131c, 131d, 131e, 131f, and 131g, may be the conductive regions. The conductive regions disposed at opposite ends of each of the channel regions 131a, 131b, 131c, 131d, 131e, 131f, and 131g of each of the transistors T1, T2, T3, T4, T5, T6, and T7 may become a source region and a drain region such that they may serve to function as a source electrode and a drain electrode.

Referring to FIG. 4 and FIG. 5, in an embodiment, the semiconductor member 130 provided in each pixel includes a first vertical portion 132 and a second vertical portion 133 that face each other, interposing the channel region 131a of the driving transistor T1 therebetween. The first vertical portion 132 and the second vertical portion 133 may mostly be the conductive regions. The first vertical portion 132 and the second vertical portion 133 may extend in a direction parallel with the second direction Dr2 or substantially extend in a direction parallel with the second direction Dr2. The first vertical portion 132 of the semiconductor member 130 may be disposed between the vertical portion 53 included in the detour portion 153b of the control line 153 and the channel region 131a of the driving transistor T1. In an embodiment, a gap W2 between the vertical portion 53 of the control line 153 and the first vertical portion 132 of the semiconductor member 130 is greater than 0. That is, the vertical portion 53 of the control line 153 and the first vertical portion 132 of the semiconductor member 130 do not overlap each other.

The driving transistor T1 includes the channel region 131a, source and drain regions, which are the conductive regions of the semiconductor member 130, disposed at opposite ends of the channel region 131a, and a driving gate electrode 155a overlapping the channel region 131a.

The channel region 131a may be bent at least once. For example, the channel region 131a of the driving transistor T1 may have a meandering shape or a zigzag shape. In FIG. 4 and FIG. 5, the channel region 131a has a "U" shape or substantially has a "U" shape. The channel region 131a is connected with the first vertical portion 132 of the semiconductor member 130, and the first vertical portion 132 corresponds to the source region of the driving transistor T1.

In an embodiment, the driving gate electrode 155a is disposed between the first vertical portion 132 and the second vertical portion 133 of the semiconductor member 130. The driving gate electrode 155a is connected with a connection member 174 through a contact hole 61.

In an embodiment, the driving gate electrode 155a and the channel region 131a of the driving transistor T1 are disposed between the present scan line 151 and the main line portion 153a of the control line 153. In addition, according to the symmetrical structure of the two adjacent pixels PX, in an embodiment, a pair of driving gate electrodes 155a and a pair of channel regions 131a is provided between two adjacent detour portions 153b in the first direction Dr1.

The switching transistor T2 includes a channel region 131b, source and drain regions, which are the conductive regions of the semiconductor member 130, disposed in opposite ends of the channel region 131b, and a gate electrode 155b overlapping the channel region 131b. In an embodiment, a portion of the present scan line 151, overlapping the channel region 131b, forms the gate electrode 155b. The conductive region of the semiconductor member 130, disposed in an upper portion with reference to the present scan line 151 and connected to the channel region 131b, is the source region of the switching transistor T2 and is connected with the data line 171 through a contact hole 62. The channel region 131b is connected with the first vertical portion 132 of the semiconductor member 130, and the first vertical portion 132 corresponds to a drain region of the switching transistor T2.

The compensation transistor T3 includes a channel region 131c, source and drain regions, which are the conductive regions of the semiconductor member 130, disposed at opposite ends of the channel region 131c, and a gate electrode 155c overlapping the channel region 131c. In an embodiment, a portion of the present scan line 151, overlapping the channel region 131c, forms the gate electrode 155c. The gate electrode 155c may be formed of two portions for preventing a leakage current. The conductive region of the semiconductor member 130, disposed in an upper portion with reference to the present scan line 151 and connected to the channel region 131c, is the drain region of the compensation transistor T3 and is connected with the connection member 174 through a contact hole 63. The channel region 131c is connected with the second vertical portion 133 of the semiconductor member 130, and the second vertical portion 133 corresponds to a source region of the compensation transistor T3.

The initialization transistor T4 includes a channel region 131d, source and drain regions, which are the conductive regions of the semiconductor member 130, disposed at opposite ends of the channel region 131d, and a gate electrode 155d overlapping the channel region 131d. In an embodiment, a portion of the previous scan line 152, overlapping the channel region 131d, forms the gate electrode 155d. The gate electrode 155d may be formed of two portions for preventing a leakage current. The conductive region of the semiconductor member 130, disposed in a lower portion with reference to the previous scan line 152 and not connected with the compensation transistor T3, is the source region of the initialization transistor T4 and is connected with the connection member 175 through a contact hole 64.

The operation control transistor T5 includes a channel region 131e, source and drain regions, which are the conductive regions of the semiconductor member 130, disposed at opposite ends of the channel region 131e, and a gate electrode 155e overlapping the channel region 131e. In an embodiment, a portion of the control line 153, overlapping the channel region 131e, forms the gate electrode 155e. In a particular embodiment, a portion of the main line portion 153a of the control line 153, overlapping the channel region 131e, forms the gate electrode 155e. The conductive region of the semiconductor member 130, disposed in a lower portion with reference to the control line 153, is the source region of the operation control transistor T5 and is connected with the driving voltage line 172 through a contact hole 65. The channel region 131e is connected with the first vertical portion 132 of the semiconductor member 130, and the first vertical portion 132 corresponds to the drain region of the operation control transistor T5.

The light emission control transistor T6 includes a channel region 131f, source and drain regions, which are the conductive regions of the semiconductor member 130, disposed at opposite ends of the channel region 131f, and a gate electrode 155f overlapping the channel region 131f. In an embodiment, a portion of the control line 153, overlapping the channel region 131f, forms the gate electrode 155f. In a particular embodiment, a portion of the main line portion 153a of the control line 153, overlapping the channel region 131f, forms the gate electrode 155f. The conductive region of the semiconductor member 130, disposed in a lower portion with reference to the control line 153, is the drain region of the light emission control transistor T6 and is connected with a connection member 179 through a contact hole 66. The channel region 131f is connected with the second vertical portion 133 of the semiconductor member 130, and the second vertical portion 133 corresponds to the source region of the light emission control transistor T6.

The bypass transistor T7 includes a channel region 131g, source and drain regions, which are the conductive regions of the semiconductor member 130, disposed at opposite ends of the channel region 131g, and a gate electrode 155g overlapping the channel region 131g. In an embodiment, a portion of the previous scan line 152, overlapping the channel region 131g, forms the gate electrode 155g. The conductive region of the semiconductor member 130, disposed in a lower portion with reference to the previous scan line 152, is the drain region of the bypass transistor T7, and is connected with the source region of the initialization transistor T4 and is connected with a connection member 175 through the contact hole 64. The conductive region of the semiconductor member 130, disposed in a lower portion with reference to the previous scan line 152, is the source region of the bypass transistor T7, and is connected with the drain region of the light emission control transistor T6 and is connected with the connection member 179 through the contact hole 66.

In an embodiment, a first end of the channel region 131a of the driving transistor T1 is connected with the switching transistor T2 and the operation control transistor T5, and a second end of the channel region 131a is connected with the compensation transistor T3 and the light emission control transistor T6.

In an embodiment, the capacitor Cst includes the driving gate electrode 155a and the expansion portion 178 of the driving voltage line 172, overlapping each other as two terminals. The capacitor Cst may maintain a voltage difference that corresponds to a difference between the driving voltage ELVDD transmitted through the driving voltage line 172 and a voltage of the driving gate electrode 155a. In a present exemplary embodiment, when the capacitor Cst is formed by directly overlapping the driving gate electrode 155a of the driving transistor T1 and a part of the driving voltage line 172, and interposing an insulation layer therebetween, an additional electrode for forming the capacitor Cst is not needed such that a manufacturing cost can be reduced. The capacitor Cst may have a wide area so that the capacitor Cst has sufficient capacity and space efficiency can be increased.

The driving gate electrode 155a is connected with a first end of the connection member 174 through the contact hole 61, and a second end of the connection member 174 is connected with the drain region of the compensation transistor T3 and the drain region of the initialization transistor T4 through the contact hole 63. The connection member 174 may extend in a direction that is parallel with the second direction Dr2 or may substantially extend in a direction that is parallel with the second direction Dr2. The connection member 174 corresponds to a driving gate node GN shown in the circuit diagram of FIG. 2, together with the driving gate electrode 155a.

The connection member 179 is connected with a pixel electrode (not shown) through a contact hole 81. In an embodiment, the connection member 175 is connected with an initialization voltage line (not shown) that transmits the initialization voltage Vint through a contact hole 82.

In an embodiment, the semiconductor member 130 includes a conductive member 135 (e.g., a conductor) overlapping the data line 171. In an embodiment, the conductive member 135 is included in the conductive region of the semiconductor member 130. The conductive member 135 may extend in parallel with the second direction Dr2 or substantially extend in parallel with the second direction Dr2. As previously described, in an embodiment, the conductive member 135 completely overlaps the data line 171 in the first direction Dr1. In an embodiment, the width of the conductive member 135 in the first direction Dr1 is greater than the width of the data line 171 in the first direction Dr1.

In the exemplary embodiment shown in FIG. 4 and FIG. 5, one conductive member 135 overlaps both of two adjacent data lines 171 according to the symmetrical structure of two adjacent pixels PX. In this embodiment, a single conductive member 135 completely overlaps two adjacent data lines 171 in the first direction Dr1. That is, in an embodiment, the width of one conductive member 135 in the first direction Dr1 is greater than the sum of the widths of two adjacent data lines 171 in the first direction Dr1.

In an embodiment, the conductive member 135 is connected with a connection portion 134, and the connection portion 134 is connected with the driving voltage line 172 through the contact hole 65 and thus receives the driving voltage ELVDD therefrom. The connection portion 134 may extend in parallel with or substantially extend in parallel with the first direction Dr1.

The conductive member 130 having conductivity shields the data line 171 by overlapping the data line 171 such that a parasitic capacitance between the data line 171 and its adjacent driving gate electrode 155a can be blocked. In particular, the conductive member 135 blocks the parasitic capacitance between the data line 171 and the driving gate electrode 155a such that fluctuation of the driving current Id of the organic light emitting diode OLED due to a voltage change of the driving gate electrode 155a according to a signal change of the data signal Dm can be prevented. That is, crosstalk, which is a luminance change caused by the parasitic capacitance between the data line 171 and the driving gate electrode 155a, can be prevented.

The conductive member 135 is a part of the semiconductor member 130. Thus, no additional electrode needs to be formed for shielding the data line 171, and accordingly, the data line 171 can be shielded without increasing manufacturing cost.

In addition, since the control line 153, specifically, the detour portion 153b of the control line 153, passes through the data line 171 and the driving gate electrode 155a when viewed in a plan view, generation of the parasitic capacitance between the data line 171 and the driving gate electrode 155a can be more effectively blocked by shielding between the data line 171 and the driving gate electrode 155a.

The conductive member 135 and the connection portion 134 of the semiconductor member 130 do not overlap signal lines transmitting a signal in the first direction Dr1 in the display panel 100. In detail, the conductive member 135 of the semiconductor member 130 does not overlap the plurality of scan lines 151 and 152 and the plurality of control lines 153.

Although an imaginary line (e.g., see IML in FIG. 4) of the main line portion 153a of the control line 153 extends past an edge of the conductive member 135, the conductive member 135 does not overlap the control line 153. As previously described, the main line portion 153a of the control line 153 extends in the first direction Dr1 and is then bent in the second direction near the conductive member 135 such that a detour portion 153b is formed, and the detour portion 153b extends in the second direction Dr2 between the conductive member 135 and the first vertical portion 132 of the semiconductor member 130 and thus the control line 153 does not overlap the conductive member 135. A vertical portion 53 of the detour portion 153b is bent in the first direction Dr1 near an upper edge of the conductive member 135 and is thus connected to a horizontal portion 54, and the horizontal portion 54 is bent in the second direction Dr2 near the edge of the conductive member 135 after extending along the upper edge of the conductive member 135 and then connected to another vertical portion 53. Accordingly, the detour portion 153b may be bent while extending along the periphery of the conductive member 135.

In an embodiment, a gap W1 (e.g., space) between the conductive member 135 and the control line 153 is greater than 0, and a gap W3 between the conductive member 135 and the horizontal portion 54 of the control line 153 is greater than 0. That is, the vertical portion 53 and the horizontal portion 54 of the control line 153 and the conductive member 135 of the semiconductor member 130 do not overlap each other.

If the control line 153 did not include the detour portion 153b and continuously extended in the first direction Dr1 like the scan lines 151 and 152, the control line 153 would overlap the conductive member 135 of the semiconductor member 130, and in this case, an additional parasitic capacitance may be generated. When the additional parasitic capacitance is generated, the conductive member 135 is substantially floated such that a voltage of the conductive member 135 fluctuates rather than maintaining a constant voltage level such as the driving voltage ELVDD. When the conductive member 135 is floated and thus the voltage becomes inconsistent, the data signal Dm transmitted by the data line 171 is influenced by such a conductive member 135, resulting in occurrence of color deviation or a stain in an image displayed in the display panel 100.

However, according to the present exemplary embodiment, the control line 153 forms the detour portion 153b to avoid overlapping the conductive member 135 of the semiconductor member 153b, and the detour portion 153b does not overlap the conductive member 135 by being formed along the periphery of the conductive member 135 such that unnecessary overlap between the conductive member 135 and the control line 153 and generation of the parasitic capacitance due to the unnecessary overlapping can be prevented. Accordingly, the data signal Dm transmitted by the data line 171 can be prevented from undergoing an undesired variation, thereby preventing occurrence of color deviation and stain in an image displayed by the display device.

Referring to FIG. 4 and FIG. 5, the conductive member 135 includes a recess portion 31 of which the width in the first direction Dr1 is smaller than other widths. The recess portion 31 does not overlap the data line 171. The recess portion 31 may be disposed on an imaginary line (e.g., see IML of FIG. 4) of the main line portion 153a of the control line 153. In an embodiment, the width of the recess portion 31 in direction Dr1 is smaller than a width of a remaining portion of the conductive member 135 in the same direction Dr1. The size of the recess portion 31 may be appropriately adjusted with consideration of the shield effect of the data line 171 through the overlap area of the conductive member 135 and the data line 171 and the degree of delay of the data signal Dm due to the overlap with the conductive member 135.

Hereinafter, an example of a cross-sectional structure of a display device according to an exemplary embodiment of the present invention will be described with reference to FIG. 6 to FIG. 8, together with FIG. 4 and FIG. 5.

A display panel of the display device according to the present exemplary embodiment includes a substrate 110. The substrate 110 may be an insulation substrate including glass, quartz, ceramic, or plastic.

A buffer layer 120 is disposed on the substrate 110. The buffer layer 120 blocks permeation of an impurity into an upper layer of the buffer layer 120, particularly, into a semiconductor member 130, so that a characteristic of the semiconductor member 130 can be improved and stress can be alleviated. The buffer layer 120 may include an inorganic insulation material such as a silicon nitride (SiNx) or a silicon oxide (SiOx), or an organic insulation material. The buffer layer 120 can be omitted.

The semiconductor member 130, which is the same as previously described, is disposed on the buffer layer 120, and a gate insulation layer 140 is disposed on the semiconductor member 130.

A gate conductor including a present scan line 151 including gate electrodes 155b and 155c described above, a previous scan line 152 including gate electrodes 155d and 155g, a control line 153 including gate electrodes 155e and 155f, a driving gate electrode 155a, and a connection member 154 are disposed on the gate insulating layer 140. The gate conductor may include a metal such as copper (Cu), aluminum (Al), molybdenum (Mo), or an alloy thereof.

An interlayer insulation layer 160 is disposed on the gate conductor and the gate insulating layer 140. The interlayer insulation layer 160 may include an inorganic insulation material such as a silicon nitride (SiNx), a silicon oxide (SiOx), or an organic insulation material.

The interlayer insulation layer 160 and/or the gate insulating layer 140 may include a contact hole 61 provided on the driving gate electrode 155a, a contact hole 62 provided on a source region among a conductive region of the semiconductor member 130, connected with a channel region 131b of a switching transistor T2, a contact hole 63 provided on a drain region among the conductive region of the semiconductor member 130, connected with a channel region 131c of a compensation transistor T3 or a drain region connected to a channel region 131d of an initialization transistor T4, a contact hole 64 provided on a source region of the conductive region of the semiconductor member 130, connected to the channel region 131d of the initialization transistor T4 or a drain region connected with a channel region 131g of a bypass transistor T7, a contact hole 65 provided on a source region of the conductive region of the semiconductor member 130, connected with a channel region 131e of an operation control transistor T5, a contact hole 66 provided on a drain region of the conductive region of the semiconductor member 130, connected to a channel region 131f of a light emission control transistor T6, and a contact hole 68 provided on the connection member 154.

A data conductor including a data line 171, a driving voltage line 172 including an expansion portion 178, and a plurality of connection members 174, 175, and 179 are provided on the interlayer insulation layer 160. The data conductor may include a metal such as copper (Cu), aluminum (Al), molybdenum (Mo), or an alloy thereof.

The data line 171 is connected with the source region connected to the channel region 131b of the switching transistor T2 through the contact hole 62 formed in the gate insulating layer 140 and the interlayer insulation layer 160. Referring to FIG. 8, the data line 171 overlaps a conductive member 135 of the semiconductor member 130, and the interlayer insulation layer 160 and the gate insulating layer 140 are interposed between the data line 171 and the conductive member 135.

Referring to FIG. 6, the expansion portion 178 of the driving voltage line 172 forms a capacitor Cst since the expansion portion 178 overlaps the driving gate electrode 155a and an interlayer insulation layer 160 is interposed between the expansion portion 178 and the driving gate electrode 155a.

Referring to FIG. 7, the connection member 174 may be connected with the drain region connected to the channel region 131c of the compensation transistor T3 and the drain region connected to the channel region 131d of the initialization transistor T4.

The connection member 175 is connected with the source region connected to the channel region 131d of the initialization transistor T4 and the drain region connected to the channel region 131g of the bypass transistor T7 through the contact hole 64.

Referring to FIG. 6, the connection member 179 is connected with the drain region connected to the channel region 131f of the light emission control transistor T6 through the contact hole 66.

A passivation layer 180 is disposed on the data conductor and the interlayer insulation layer 160. The passivation layer 180 may include an organic insulation material such as a polyacrylate resin, or a polyimide resin, and the upper surface of the passivation layer 180 may be flat or substantially flat. The passivation layer 180 includes a contact hole 81 disposed on the connection member 179 and a contact hole 82 disposed on the connection member 175.

A pixel electrode 191 and an initialization voltage line 192 are disposed on the passivation layer 180. Referring to FIG. 6 and FIG. 7, the pixel electrode 191 is connected with the connection member 179 through the contact hole 81 and is connected with the connection member 175 through the contact hole 82.

A pixel defining layer PDL 350 is disposed on the passivation layer 180, the initialization voltage line 192, and the pixel electrode 191. The pixel defining layer 350 includes an opening 351 disposed on the pixel electrode 191.

An organic emission layer 370 is disposed on the pixel electrode 191. The organic emission layer 370 is disposed in the opening 351.

A common electrode 270 is disposed on the organic emission layer 370. The common electrode 270 may also be disposed on the pixel defining layer 350 and thus extend over the plurality of pixels PX.

The pixel electrode 191, the organic emission layer 370, and the common electrode 270 form an organic light emitting diode OLED.

An encapsulation layer (not shown) that protects the organic light emitting diode OLED may be further disposed on the common electrode 270. The encapsulation layer may include an inorganic layer and an organic layer that are alternately layered.

Next, a display device according to an exemplary embodiment of the present invention will be described with reference to FIG. 9 and FIG. 10, together with the above drawings. The same constituent elements as in the exemplary embodiments described above designate the same reference numerals.

Figure 9:
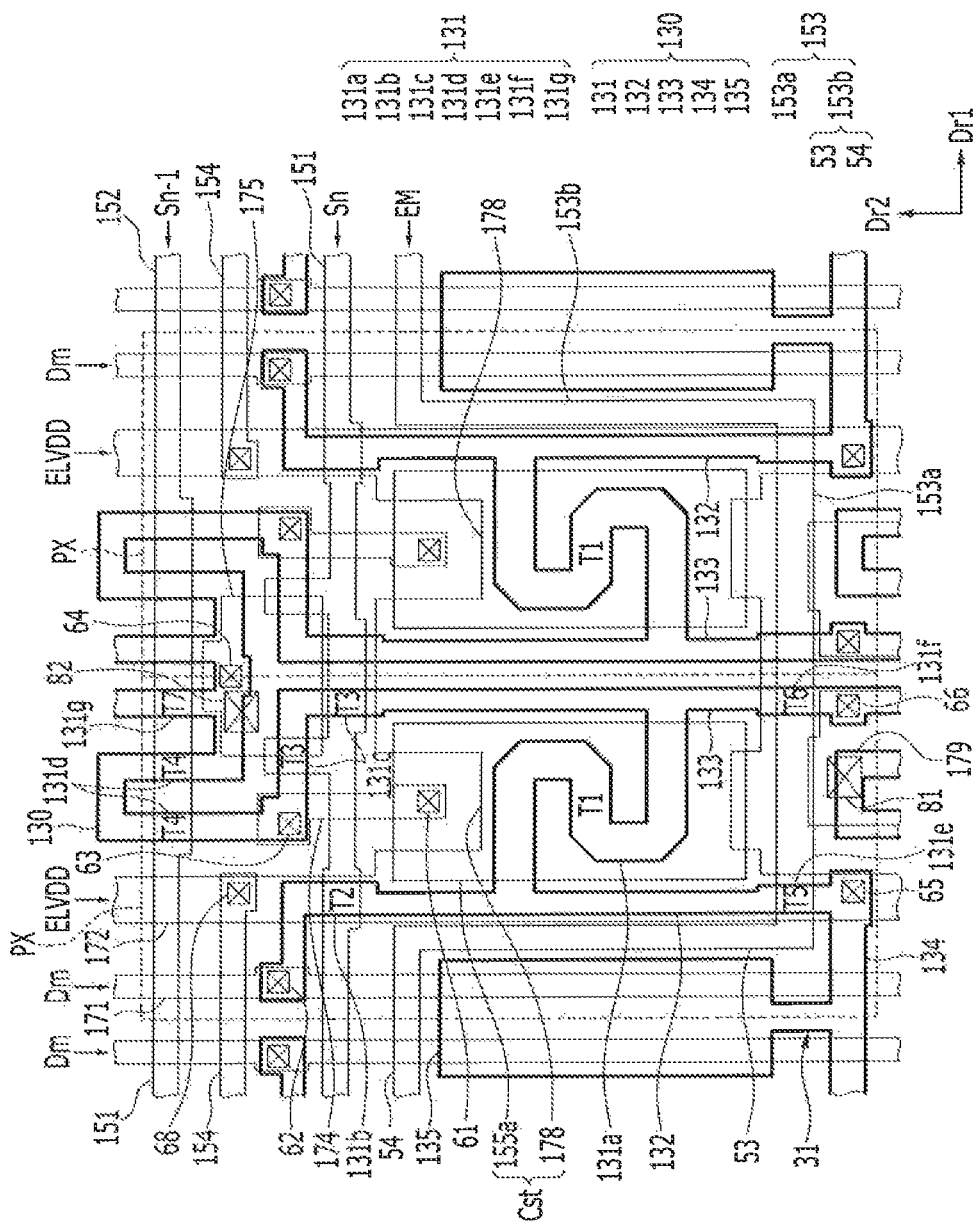
FIG. 9 is a layout view of two adjacent pixels in a pixel of a display device according to an exemplary embodiment of the present invention.
Figure 10:
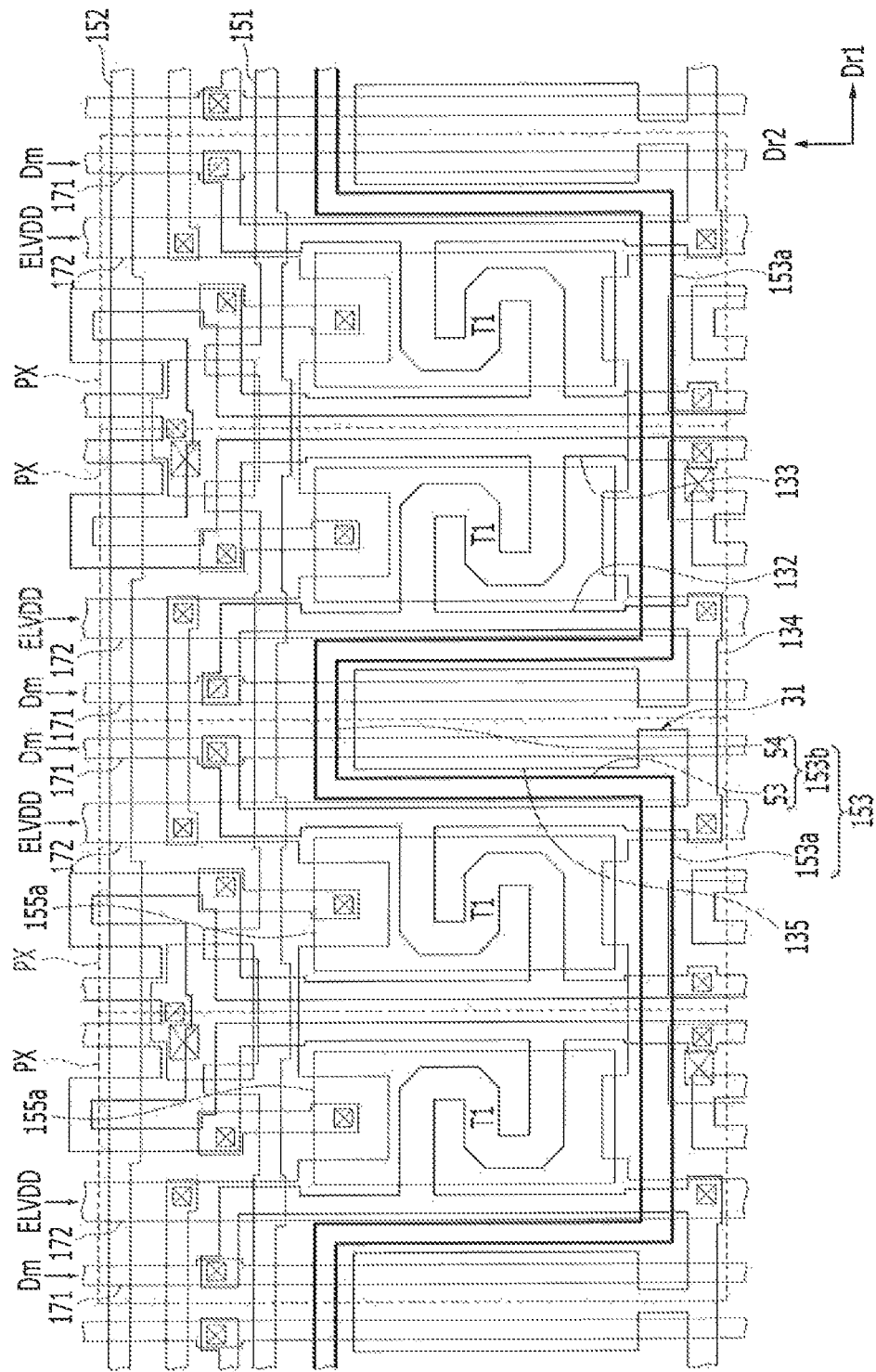
FIG. 10 is a layout view of four adjacent pixels in the display device according to an exemplary embodiment of the present invention.

FIG. 9 is a layout view of two adjacent pixels of a display device according to an exemplary embodiment of the present invention, and FIG. 10 is a layout view of four adjacent pixels of the display device according to the exemplary embodiment of the present invention.

Referring to FIG. 9 and FIG. 10, a display device according to the present exemplary embodiment is the same as the display device according to the above-described exemplary embodiment of FIG. 4 to FIG. 8, except for the shape of a channel region 131a of a driving transistor T1 in a plane view. For example, in the embodiment of FIG. 9 and FIG. 10, the channel region 131a of the driving transistor T1 has an "S" shape or an inverted "S" shape.

Other features and effects of the display device of FIG. 9 and FIG. 10 are the same as those of the above-described exemplary embodiment of FIG. 4 to FIG. 8, and therefore no further detailed description is needed.

Next, a display device according to an exemplary embodiment of the present invention will be described with reference to FIG. 11, together with the above-described drawings.

Figure 11:
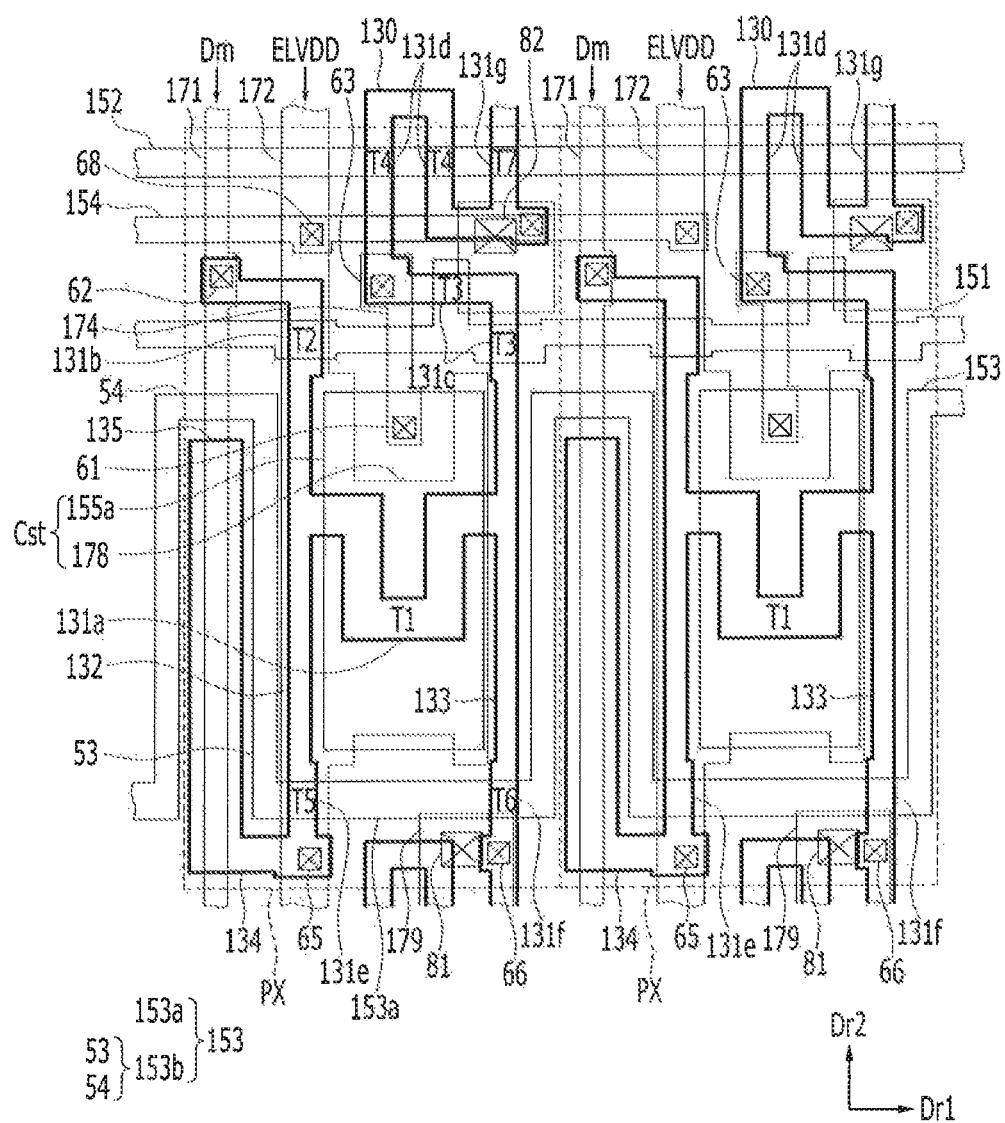
FIG. 11 is a layout view of two adjacent pixels in a display device according to an exemplary embodiment of the present invention.

FIG. 11 is a layout view of two adjacent pixels of a display device according to an exemplary embodiment of the present invention.

Referring to FIG. 11, a display device according to the present exemplary embodiment is the same as the display device according to the exemplary embodiment of FIG. 4 to FIG. 8, except that two pixels PX that are adjacent to each other in a first direction Dr1 have the same shape rather than having a symmetrical structure.

Accordingly, an expansion portion 178 of a driving voltage line 172 located in one pixel PX is disposed in a limited area of the corresponding pixel PX. In addition, a conductive member 135 of a semiconductor member 130 overlaps one data line 171 provided between two adjacent pixels PX.

A pitch, which is a spatial period where a control line 153 is bent, may be the same as or approximately the same as the width of one pixel PX in the first direction Dr1. That is, in an embodiment, a distance between the center of a horizontal portion 54 of one detour portion 153b of the control line 153 and the center of a horizontal portion 54 of its adjacent detour portion 153b is the same as or is approximately the same as the width of one pixel PX in the first direction Dr1.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the disclosure.

What is claimed is:

1. A display device comprising:
   a scan line extending in a first direction;
   a first data line crossing the scan line and transmitting a data signal;
   a first driving voltage line crossing the scan line and transmitting a driving voltage;
   a conductive member including a portion connected to the first driving voltage line and overlapping the first data line, wherein a first insulation layer is interposed between the conductive member and the first data line; and
   a control line including a plurality of main line portions each extending in the first direction, and a detour portion that is located between two of the plurality of main line portions that are adjacent one another in a plan view,
   wherein the detour portion connects the two adjacent main line portions together,
   wherein a part of the detour portion is located between the conductive member and the first driving voltage line in the plan view.

2. The display device of claim 1, further comprising a first driving gate electrode spaced apart from the control line,
   wherein the detour portion comprises a portion located between the first driving gate electrode and the conductive member in the plan view.

3. The display device of claim 2, further comprising a semiconductor member including a first channel region overlapping the first driving gate electrode, wherein a second insulation layer is interposed between the semiconductor member and the first channel region,
   wherein the semiconductor member comprises a plurality of channel regions and a conductive region, the plurality of channel regions including the first channel region, and
   the conductive region comprises the conductive member.

4. The display device of claim 3, wherein the plurality of channel regions comprise at least one channel region overlapping the control line.

5. The display device of claim 3, wherein
   the first insulation layer comprises a contact hole disposed on the conductive region of the semiconductor member, and
   the first driving voltage line is connected to the conductive region through the contact hole.

6. The display device of claim 5, wherein
   the conductive member is connected to the conductive region that is connected to the first driving voltage line through a connection portion extending in a direction that is different from an extending direction of the conductive member.

7. The display device of claim 2, wherein
   the detour portion comprises a pair of vertical portions extending in parallel with the first data line and a horizontal portion connecting the pair of vertical portions.

8. The display device of claim 7, wherein
   the scan line is located in a same layer as the control line in a cross sectional view, and
   the plurality of channel regions comprise at least one channel region overlapping the scan line.

9. The display device of claim 8, wherein the horizontal portion is located between the conductive member and the scan line in the plan view.

10. The display device of claim 8, wherein the first driving gate electrode is located between the scan line and the horizontal portion of the control line in the plan view.

11. The display device of claim 7, wherein the horizontal portion crosses the first data line.

12. The display device of claim 7, wherein the vertical portion is located between the conductive member and the first driving gate electrode in the plan view.

13. The display device of claim 2, wherein
   the first driving voltage line extends in a second direction that crosses the first direction, and
   the first driving voltage line comprises a first expansion portion that extends in the first direction,
   the first driving voltage line overlapping the first driving gate electrode and the first insulation layer interposed between the first driving voltage line and the first driving gate electrode forms a capacitor.

14. The display device of claim 13, further comprising a second data line adjacent the first data line, wherein the conductive member overlaps the second data line.

15. The display device of claim 14, further comprising:
   a second driving gate electrode;
   a second driving voltage line comprises a second expansion portion that extends in the first direction,
   wherein the two driving gate electrodes are located between the two data lines, and
   wherein the two expansion portions respectively overlapping the two driving gate electrodes are connected to each other.

16. The display device of claim 1, wherein
   the main line portions do not overlap the conductive member,
   the detour portion does not overlap the conductive member and extends along a periphery of the conductive member.

17. The display device of claim 16, wherein
   the conductive member comprises a recess portion that does not overlap the data line in the plan view.

18. A display device comprising:
   a scan line extending in a first direction;
   a data line and a driving voltage line extending in a second direction that crosses the first direction;

a control line comprising a first portion that is parallel with the first direction, a second portion connected to the first portion and parallel with the second direction, and a third portion connected to the second portion and parallel with the first direction; and a driving gate electrode located between a first scan line among the plurality of scan lines and the first portion of the control line in a plan view, wherein the second portion of the control line is located between the data line and the driving gate electrode in the plan view, and the third portion of the control line crosses the data line.

19. The display device of claim 18, further comprising a conductive member connected to the driving voltage line and overlapping the data line, wherein the second portion and the third portion extend along a periphery of the conductive member.

20. The display device of claim 19, wherein the second portion is located between the driving gate electrode and the conductive member in the plan view.

21. The display device of claim 20, further comprising a semiconductor member comprising a channel region overlapping the driving gate electrode, an insulation layer interposed between the channel region and the driving gate electrode, and a conductive region connected to the channel region, wherein the conductive region comprises the conductive member.

22. A display device comprising a plurality of pixels, wherein each pixel comprises:

an organic light emitting diode (OLED);

a light emission control transistor connected to the OLED;

a control line configured to apply an emission control signal to a gate electrode of the light emission control transistor;

a data line transmitting a data signal;

a conductor overlapping the data line and receiving a driving voltage, wherein the control line is bent around a periphery of the conductor.

23. The display device of claim 22, wherein the control line includes a first portion arranged in a direction of the data line, a second portion arranged in a direction perpendicular to the data line, and a third portion arranged in the direction of the data line.

24. The display device of claim 22, wherein the conductor comprises a recess portion that does not overlap the data line that connects a remaining portion of the conductor to a driving voltage line supplying the driving voltage.

25. The display device of claim 24, where a width of the recess portion is less than a width of the remaining portion.

26. The display device of claim 22, further comprising:

an operation control transistor connected between the driving voltage and the light emission control transistor;

a driving transistor connected between the operation control transistor and the light emission control transistor;

a capacitor connected between the driving voltage and a gate of the driving transistor; and a switching transistor connected between the data line and a node between the operation control transistor and the driving transistor, wherein a gate electrode of the switching transistor receives a scanning signal.

* * * * *